US009181124B2

(12) United States Patent
Cording et al.

(10) Patent No.: US 9,181,124 B2
(45) Date of Patent: Nov. 10, 2015

(54) TRANSPARENT CONDUCTIVE OXIDE COATING FOR THIN FILM PHOTOVOLTAIC APPLICATIONS AND METHODS OF MAKING THE SAME

(75) Inventors: Christopher R. Cording, Kingsport, GA (US); Kunio Masumo, Zama (JP); Sveinn Otto Agustsson, Brussels (BE)

(73) Assignees: AGC FLAT GLASS NORTH AMERICA, INC., Alpharetta, GA (US); AGC FLAT GLASS EUROPE, S.A., Brussels (BG); ASAHI GLASS COMPANY, LIMITED, Tokyo (JP)

( * ) Notice: Subject to any disclaimer, the term of this patent is extended or adjusted under 35 U.S.C. 154(b) by 799 days.

(21) Appl. No.: 12/263,648

(22) Filed: Nov. 3, 2008

(65) Prior Publication Data

US 2009/0120496 A1 May 14, 2009

Related U.S. Application Data

(60) Provisional application No. 60/996,144, filed on Nov. 2, 2007.

(51) Int. Cl.
*C03C 17/34* (2006.01)
*C23C 16/40* (2006.01)
*H01L 31/18* (2006.01)
*H01L 31/0216* (2014.01)

(52) U.S. Cl.
CPC ......... *C03C 17/3423* (2013.01); *C03C 17/3417* (2013.01); *C03C 17/3435* (2013.01); *C03C 17/3441* (2013.01); *C23C 16/407* (2013.01); *H01L 31/1884* (2013.01); *C03C 2217/94* (2013.01); *C03C 2217/948* (2013.01); *C03C 2218/324* (2013.01); *Y02E 10/50* (2013.01)

(58) Field of Classification Search
USPC ............. 427/74, 126.1, 126.3, 162, 164, 165, 427/255.19, 255.32, 255.35, 419.3, 585
See application file for complete search history.

(56) References Cited

U.S. PATENT DOCUMENTS

| 3,655,545 | A | | 4/1972 | Gillery et al. |
| 4,731,256 | A | | 3/1988 | Russo et al. |
| 5,011,585 | A | | 4/1991 | Brochot et al. |
| 5,101,260 | A | | 3/1992 | Nath et al. |
| 5,147,688 | A | | 9/1992 | Melas |
| 5,254,179 | A | | 10/1993 | Ricaud et al. |
| 5,322,540 | A | | 6/1994 | Jacquet et al. |
| 5,487,918 | A | | 1/1996 | Akhtar |
| 5,501,883 | A | | 3/1996 | Ishikawa et al. |
| 5,508,092 | A | | 4/1996 | Kimock et al. |
| 5,530,581 | A | * | 6/1996 | Cogan ........................... 359/265 |
| 5,593,901 | A | | 1/1997 | Oswald et al. |
| 5,603,778 | A | | 2/1997 | Sonoda |
| 5,770,314 | A | | 6/1998 | Suga et al. |
| 5,776,236 | A | | 7/1998 | Neuman et al. |
| 5,780,149 | A | | 7/1998 | McCurdy et al. |
| 5,897,957 | A | * | 4/1999 | Goodman ........................ 428/432 |
| 5,977,477 | A | | 11/1999 | Shiozaki |
| 6,114,043 | A | | 9/2000 | Joret |
| 6,124,026 | A | * | 9/2000 | McCurdy et al. ............. 428/216 |
| 6,165,598 | A | * | 12/2000 | Nelson .......................... 428/212 |
| 6,218,018 | B1 | | 4/2001 | McKown et al. |
| 6,235,343 | B1 | | 5/2001 | Joret et al. |
| 6,315,874 | B1 | | 11/2001 | Suzuki et al. |
| 6,416,890 | B1 | * | 7/2002 | Terneu et al. .................. 428/701 |
| 6,492,528 | B1 | * | 12/2002 | Matsuba et al. ............ 548/316.4 |
| 6,498,380 | B1 | | 12/2002 | Otani et al. |
| 6,503,557 | B1 | | 1/2003 | Joret |
| 6,524,647 | B1 | | 2/2003 | Varanasi et al. |
| 6,551,715 | B1 | | 4/2003 | Seto et al. |
| 6,602,606 | B1 | | 8/2003 | Fujisawa et al. |
| 6,641,937 | B1 | | 11/2003 | Kiuchi et al. |
| 6,703,130 | B2 | | 3/2004 | Ogura et al. |
| 6,777,477 | B1 | | 8/2004 | Niume et al. |
| 6,787,231 | B1 | | 9/2004 | Furman et al. |
| 6,787,240 | B2 | | 9/2004 | Getz |
| 6,787,692 | B2 | | 9/2004 | Wada et al. |
| 6,797,388 | B1 | | 9/2004 | Szanyi et al. |
| 6,818,309 | B1 | * | 11/2004 | Talpaert et al. ................ 428/432 |
| 6,827,970 | B2 | | 12/2004 | Varanasi et al. |
| 6,866,885 | B1 | | 3/2005 | Clough |
| 7,060,320 | B1 | | 6/2006 | Omote et al. |
| 7,259,085 | B2 | | 8/2007 | Fujisawa et al. |
| 7,332,226 | B2 | | 2/2008 | Fujisawa et al. |
| 2004/0256685 | A1 | * | 12/2004 | Chou et al. ..................... 257/414 |
| 2005/0164014 | A1 | * | 7/2005 | Tomonaga et al. ............ 428/432 |
| 2005/0181619 | A1 | * | 8/2005 | Hwu et al. ..................... 438/745 |
| 2006/0014027 | A1 | * | 1/2006 | Oudard .......................... 428/428 |

FOREIGN PATENT DOCUMENTS

| CN | 1085346 A | 4/1994 |
| JP | 63-184210 A | 7/1988 |
| JP | 01-189815 A | 7/1989 |
| JP | 02-168507 A | 6/1990 |
| JP | H6-263443 A | 9/1994 |

(Continued)

OTHER PUBLICATIONS

Peter F. Gerhardinger, et al., 1996, "Float Line Deposited Transparent Conductors-Implications for the PV Industry", Materials Research Society, vol. 425, pp. 399-410.
PCT International Search Report, issued in PCT/US 2008/012409 on Feb. 18, 2009, 14 pages.

(Continued)

Primary Examiner — Atul P. Khare
(74) Attorney, Agent, or Firm — Rothwell, Figg, Ernst & Manbeck, P.C.

(57) ABSTRACT

The present invention provides transparent conductive oxide (TCO) thin films with improved optical and electrical properties and methods of making the same. More specifically, the invention provides on-line processes for producing TCO thin films that allow for improvements in optical properties and post-production improvements in electrical properties of the TCO.

20 Claims, 10 Drawing Sheets

(56) References Cited

FOREIGN PATENT DOCUMENTS

| JP | 07-224383 A | 8/1995 |
|---|---|---|
| JP | 2001-35275 A | 2/2001 |
| JP | 2001-240430 A | 9/2001 |
| JP | 2002-146536 A | 5/2002 |
| JP | 2003-081633 A | 3/2003 |
| JP | 2005-029463 A | 2/2005 |
| JP | 2006-62958 A | 3/2006 |
| JP | 2006-277769 A | 10/2006 |
| WO | 2005/072947 A1 | 8/2005 |
| WO | 2005/118478 A1 | 12/2005 |
| WO | 2006/117345 A1 | 11/2006 |

OTHER PUBLICATIONS

Written Opinion, issued in Singapore Patent Application No. 201003038-5 on Mar. 14, 2012, 8 pages.
Chinese Office Action issued in CN 20880123892.7 on Aug. 27, 2012, including English language translation, 12 pages.
Chinese Office Action issued in CN 20880123892.7 on May 3, 2013, including English language translation, 11 pages.
Egyptian Office Action issued in EG 2010050712 on Sep. 1, 2012, including English language translation, 5 pages.
Australian Examination Report issued in AU 2008319304 on Jan. 11, 2013, 3 pages.
Written Opinion issued in PCT/US2008/012409 on Sep. 1, 2011, 7 pages.
Israeli Notification issued in IL 205443 on Jan. 30, 2013, only with English language translation, 4 pages.
Malaysian Substantive Examination Adverse Report issued in PI 2010001965 on Mar. 29, 2013, 3 pages.
Russian Office Action issued in RU 2010 122 049 on Sep. 18, 2012, only with English language translation, 6 pages.
Russian Office Action issued in RU 2010 122 049 on Jul. 2, 2013, only with English language translation, 7 pages.
Taiwanese Office Action issued in TW 097142396 on Sep. 12, 2013, 7 pages.
Japanese Office Action issues in JP 2010-532067 on Oct. 1, 2013, 4 pages.
H. Bisht, et al., "Comparison of Spray Pyrolyzed FTO, ATO and ITO coatings for flat and bent glass substrates," Thin Solid Films (1999).
Wen-Yen Chuang, "Investigation on Properties of ITO Transparent Conducting Films Added with Different Metals Prepared by Co-sputtering System," National Cheng Kung University, with English language abstract (Jun. 2004).
B. M. Davies et al., "Diffusion barrier of sol-gel derived silica for sprayed tin oxide film on soda-lime glass," J. Mater. Res., vol. 9, No. 1, pp. 226-228 (Jan. 1994).
Israeli Official Notification issued in IL 205443 on Mar. 3, 2014, in English language translation, 2 pages.
Australian Examination Report issued in Au 2008319304 on Nov. 15, 2013, 5 pages.
Indian First Examination Report issued in in 3902/DELNP/2010 on May 11, 2015, 2 pages.
Indonesian substantive report issued in ID W-00201001779 on Mar. 12, 2015, 4 pages.
Korean Office Action issued in KR 2010-7012120 on Dec. 29, 2014, including English language translation, 8 pages.
Japanese Office Action issued in JP 2014-204772 on Aug. 4, 2015, including English translation, 7 pages.
Taiwanese Office Action issued in TW 10421073580 on Aug. 12, 2015, 5 pages.

* cited by examiner

TRANSPARENT CONDUCTIVE OXIDE COATING FOR THIN FILM PHOTOVOLTAIC APPLICATIONS AND METHODS OF MAKING THE SAME

CROSS-REFERENCE TO RELATED APPLICATION

This application claims the benefit of U.S. Provisional Application No. 60/996,144, filed Nov. 2, 2007, which is hereby incorporated by reference in its entirety into the present application.

BACKGROUND OF THE INVENTION

1. Field of the Invention

The present invention relates generally to transparent conductive oxide (TCO) coatings for use in photovoltaic (PV) devices and methods of making the same. More particularly, the invention relates to improving the optical and electrical properties of transparent conductive oxide thin films and methods of making the same.

2. Discussion of the Background

All United States patents referred to herein are hereby incorporated by reference in their entireties. In the case of conflict, the present specification, including definitions, will control.

As the global population continues to grow, so does the demand for energy and energy sources. Fossil fuel consumption has seen steady increases during the last century, as expected for an energy thirsty global population. It was estimated that in 2004, 86% of human-produced energy came from the burning of fossil fuels. Fossil fuels are non-renewable resources and fossil fuel reserves are being depleted quicker than they can be replaced. As a result, a movement toward the development of renewable energy has been undertaken to meet increased demand for energy. Over the last ten to twenty years, there has been an increased focus on developing technology to efficiently harness energy from alternative sources, such as solar, hydrogen and wind energy to meet the increased global demand.

Of the alternative sources, the sun is considered the most abundant natural resource, with an infinite supply of energy showering the Earth on a daily basis. Numerous technologies exist that are directed to capturing the sun's light energy and converting it into electricity. A photovoltaic (PV) module represents such a technology and, to date, has found many applications in areas such as remote power systems, space vehicles and consumer products such as wireless devices.

PV modules are known to incorporate thin films. Thin film photovoltaics require a transparent front conductor, usually a thin film. The most common conductive thin films used are transparent conductive oxides such as fluorine-doped tin oxide (FTO), aluminum-doped zinc oxide (AZO) and indium tin oxide (ITO). The main function of a TCO is two-fold. First, the TCO allows light to pass through to an active light absorbing material beneath it. Second, the TCO serves as an ohmic contact to transport photo-generated charges away from the light absorbing material. Such TCOs are desirable for all types of photovoltaic and solar modules, and are especially desirable for photovoltaic and solar modules based on amorphous silicon.

Improving the efficiency of PV devices incorporating TCO thin films typically has been limited by a number of factors. One of these factors is the inherent limitation of the TCO thin film conductivity, whereby it has been found that attempts to increase the conductivities are hampered by a simultaneous decrease in light transmission through the TCO thin film, which, in turn, decreases the efficiency of the PV device. The benefits of small improvements in photovoltaic efficiency can accrue over the life of the module and enhance financial return. Improvements in TCO optical and electrical properties can add to photovoltaic efficiency.

While photovoltaics have found many uses, there still exists a number of obstacles to overcome before photovoltaics can be competitive with traditional fossil fuels. Along these lines, cost and light-to-electricity conversion efficiency represent two of the obstacles preventing photovoltaics from being competitive with fossil fuels.

Most PV modules that exist today are based on silicon. Glass is omnipresent and, as such, provides an existing infrastructure for deployment of PV modules. One approach along these lines has been to adapt established glass production methods for later incorporation into a PV module. One such glass production method is the float-line method for producing float, or flat, glass.

Thin films on glass are desirable for numerous reasons. For example, architectural glass that is coated with a low emissivity coating possesses better insulating properties and is more energy efficient than architectural glass that is not coated. As a result of this desirability for thin films on glass, many methods exist for producing glasses coated with thin films. One of these methods is pyrolytic chemical vapor deposition, in which a metal containing species with micron and/or submicron thicknesses are deposited directly onto the glass surface. Such metal containing species include, but are not limited to, metals, metal oxides, metal nitrides, metal oxynitrides and metal oxycarbides.

There are many methods that exist for manufacturing thin films on glass. One such method is known as the online method, defined generally herein as coating the glass ribbon during the glass production. With respect to TCO thin films on glass incorporated into PV modules, there is still a need for methods that allow for improvements in the optical and electrical properties of these films before, during and after deposition on a glass substrate.

U.S. Pat. No. 7,259,085 discloses a method of making a metal oxide thin film wherein hydrogen chloride (HCl) is added to a gas stream of starting materials used for deposition of the metal oxide thin film. The purpose of HCl addition to the starting material gas stream is to prevent the starting materials from undergoing chemical reaction prior to reaching a surface of a glass substrate. This, in turn, leads to the ability to manufacture metal oxide thin film coatings having relatively uniform film thicknesses over a wide area and a long time at high film deposition rates (about 4500 nm/min or greater). It is disclosed that when metal oxide thin film coatings made by the methods of U.S. Pat. No. 7,259,085 are incorporated into photovoltaic devices, the likelihood of defects, such as pinholes, over the lifetime of such a photovoltaic device is reduced and the conversion efficiency of the photovoltaic device can remain high. However, there is no disclosure as to whether the addition of HCl to the starting material gas stream can lead to improved electrical conductivity of the metal oxide thin film coating after deposition of the metal oxide thin film.

U.S. Pat. No. 5,698,262 discloses a method of making a doped tin oxide film using hydrogen fluoride (HF) as a dopant source in order to obtain low and uniform sheet resistance of the metal oxide thin film. The metal oxide thin film layer therein is made from the starting materials: dimethyltin dichloride, oxygen, water, hydrogen fluoride and helium. It is disclosed in U.S. Pat. No. 5,698,262 that the fluorine doped tin oxide coatings made therein exhibit lower sheet resistance and improved uniformity in sheet resistance over the coated surface of the glass. However, the fluorine doped tin oxide coating disclosed therein still suffers from hazing. With a thickness of the fluorine doped tin oxide coating of only 320 nm, the size of the crystal grains therein would be limited, thereby preventing large irregularities of the film surface, which prevents a high haze ratio from being achieved.

U.S. Pat. No. 6,551,715 discloses a glass sheet with a transparent conductive doped tin oxide film wherein the tin oxide film is processed in such a way that a decrease in the conductivity of the tin oxide film is suppressed after a heat treatment of the tin oxide film. It is disclosed in U.S. Pat. No. 6,551,715 that conventional transparent conductive films of about 200 nm thicknesses disposed on glass substrates, when heat-treated, usually undergo a considerable sheet resistance increase. In order to minimize this sheet resistance increase, the thickness of the tin oxide film is set to at least about 400 nm. It was found that the decrease in sheet resistance by increasing the tin oxide film thickness tends not to be affected by heat treatment in air.

Thus, there remains a need in the art for transparent conductive oxide thin film layers that can overcome the above-noted problems of prior art films. In particular, there is a need in the art for TCO thin films having improved electrical and optical properties and for methods of making them.

SUMMARY OF THE INVENTION

The present invention provides improvements in the optical and electrical properties of TCO thin films, as well as methods of making such improved TCO thin films.

In an aspect of the invention, there is provided methods of improving the optical and electrical properties of TCO thin films.

In an aspect of the invention, there is provided a method of improving the properties of TCO thin films through introduction of an oxidizing chemical additive other than water, air or oxygen during vapor deposition of the TCO thin film.

In another aspect of the invention, the oxidizing chemical introduced during the vapor deposition step may be an oxidizing acid such as hypochloric acid, nitric acid or sulfuric acid.

In another aspect of the invention, the oxidizing chemical introduced during vapor deposition may be non-acids such as hydrogen peroxide, ozone, pure oxygen, ammonium nitrate and other oxidizers.

In another aspect of the invention, there is provided a method of improving the properties of TCO thin films by exposure of the vapor deposited TCO thin films to a non-oxidizing, or even slightly reducing, atmosphere at elevated temperatures.

In yet another aspect of the invention, the non-oxidizing atmosphere is an inert atmosphere.

In yet another aspect of the invention, exposure of the TCO thin films to elevated temperatures is carried out at temperatures in the range from about 200° C. to about 800° C.

In yet another aspect of the invention, there is provided TCO thin films with improved optical and electrical properties made by methods in accordance with the present invention.

DETAILED DESCRIPTION OF THE INVENTION

Figure 1:
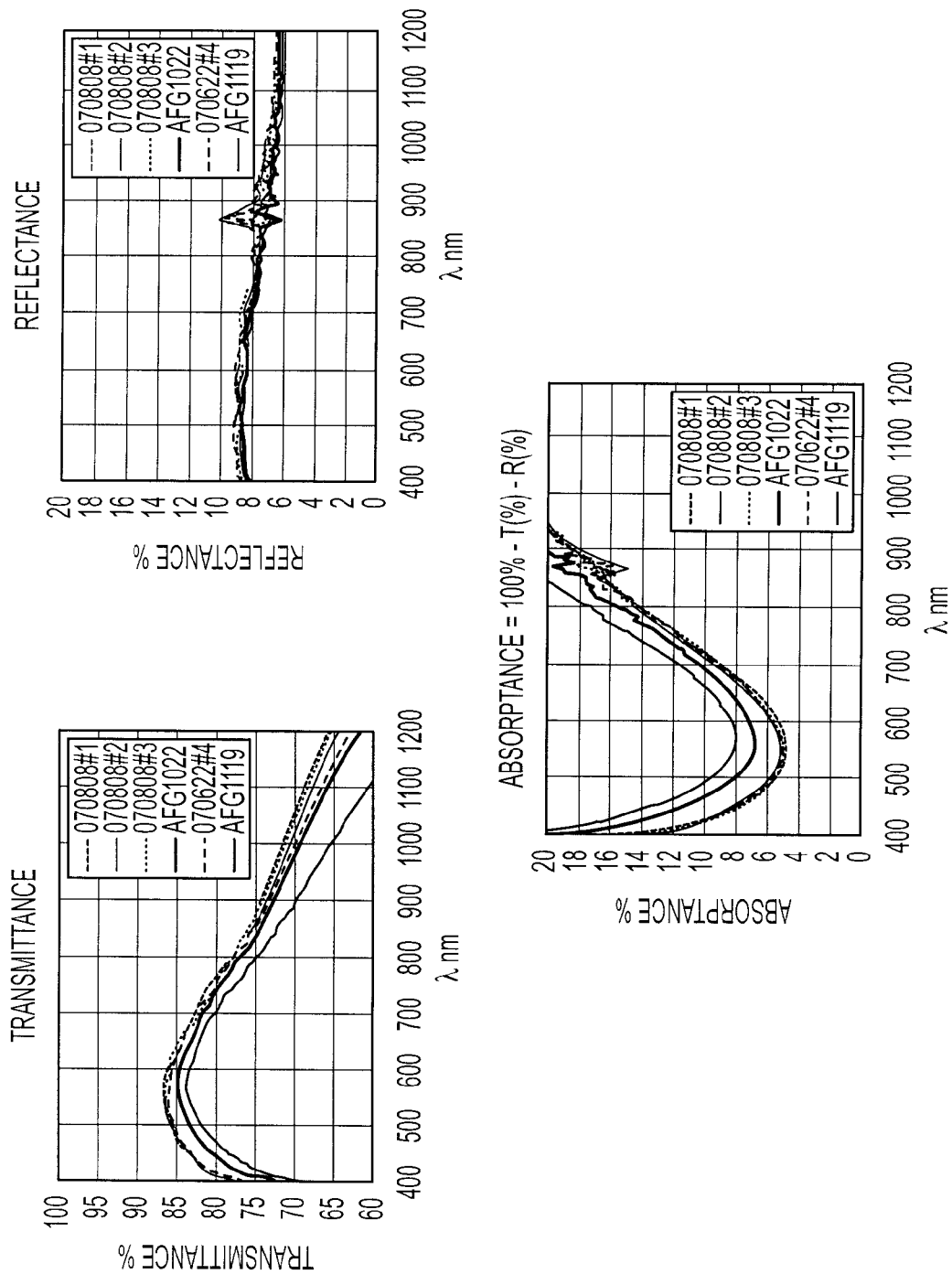
FIG. 1 shows transmittance, reflectance and absorptance data for 070808 samples 1-3 as compared to standard, non-acid treated AFG1022 and AFG1119 samples. Data for 070622, sample 4 is also shown.

While the present invention may be embodied in many different forms, a number of illustrative embodiments are described herein with the understanding that the present disclosure is to be considered as providing examples of the principles of the invention and such examples are not intended to limit the invention to preferred embodiments described and/or illustrated herein. The various embodiments are disclosed with sufficient detail to enable those skilled in the art to practice the invention. It is to be understood that other embodiments may be employed, and that structural and logical changes may be made without departing from the spirit or scope of the present invention.

The methods in accordance with the present invention can provide photovoltaic transparent conductive oxide thin film components of the general configuration: Glass substrate/Undercoating/SnO2:F. The methods in accordance with the present invention are also applicable to conductive layers disposed on multiple undercoating layers and/or nucleation layers. Such alternative multi-layered configurations will be recognized and appreciated by those of skill in the art.

As referred to herein, "AFG1119" is equivalent to both "TCO1119" and "1119" and represents the system: Glass Substrate (GS)/Undercoat Layer (UC)/SnO$_2$:F wherein the fluorine doped tin oxide thin film is deposited by pyrolytic chemical vapor deposition methods known to those of skill in this art in the absence of an oxidizing chemical additive, other than the traditionally used steam and oxygen. Such systems can have a thin film thickness in the range of 550 nm to 1000 nm. For purposes herein, this system has a thin film thickness of 611 nm.

"AFG1022" is equivalent to both "TCO1022" and "1022" and represents the system: Glass Substrate (GS)/Undercoat Layer (UC)/SnO$_2$:F wherein the fluorine doped tin oxide thin film is deposited by pyrolytic chemical vapor deposition methods known to those of skill in this art in the absence of an oxidizing chemical additive other than the traditionally used steam and oxygen. Such systems can have a thin film thickness in the range of 550 nm to 1000 nm. For purposes herein, this system has a thin film thickness of 650 nm.

"AFG070808" is equivalent to "070808" and represents the system: Glass Substrate (GS)/Undercoat Layer (UC)/SnO$_2$:F wherein the fluorine doped tin oxide thin film is deposited by pyrolytic chemical vapor deposition methods known to those of skill in this art in the presence of an oxidizing chemical additive. In this system, HNO$_3$ was the oxidizing chemical additive. Additionally, three separate samples of AFG070808 are disclosed herein as test samples 1-3 having thin film thicknesses of 550 nm, 650 nm and 613 nm, respectively.

"AFG070622" is equivalent to "070622" and represents the system: Glass Substrate (GS)/Undercoat Layer (UC)/SnO$_2$:F wherein the fluorine doped tin oxide thin film is deposited by pyrolytic chemical vapor deposition methods known to those of skill in this art in the presence of an oxidizing chemical additive. In this system, HNO$_3$ was the oxidizing chemical additive. Additionally, four separate samples of AFG070622 are disclosed herein as test samples 1-4 having fluorine doped tin oxide thin film thicknesses of 504 nm, 539 nm, 563 nm and 601 nm, respectively.

The "undercoat layer," or UC, is a silicon oxycarbide layer approximately 750 angstroms thick comprising silicon, oxygen and carbon. The UC provides the necessary index of refraction for color neutralization and thereby aids in improving the transmittance of the PVTCO device, and furthermore acts as a barrier to suppress sodium ion migration from the glass substrate to the TCO thin films and aids in improving the transmission of the photovoltaic device.

"Float glass" or "flat glass" refers to glass produced on a float-line by floating a continuous stream of molten glass onto a bath of molten tin. The molten glass spreads onto the surface of the metal and produces a high quality, consistently level sheet of glass. The glass made by this method is the standard method for glass production. In fact, over 90% of the world production of flat glass is float glass. Unless otherwise specified, when referring to glass herein, it is meant that glass is produced by float-line methods.

"Online methods" or "online" is a term well-known and understood to those in the glass coating arts and, for purposes herein, refers to coating glass ribbon during production of the glass on a float-line.

"Offline methods" or "offline" is also a term well-known and understood to those in the glass coating arts and, for purposes herein, refers to coating glass after the glass has been produced and removed from a float-line.

"Post-production" for purposes herein is taken to mean a TCO thin film that has been pyrolytically vapor deposited on glass.

"Pre-production" for purposes herein is taken to mean a TCO thin film that has yet to be pyrolytically vapor deposited on glass.

"Deposited onto" or "deposited on" as used herein means that the substance is directly or indirectly applied above the referenced layer. If applied indirectly, one or more layers may intervene. Furthermore, unless otherwise indicated, in describing coatings of the present invention by use of the format "[substance 1]/[substance 2]/[substance 3]/..." or the like, it is meant that each successive substance is directly or indirectly deposited onto the preceding substance.

"Haze" is defined herein in accordance with ASTM D 1003 which defines haze as that percentage of light which in passing through deviates from the incident beam greater than 2.5 degrees on the average. "Haze" may be measured by methods known to those of skill in this art. Haze data presented herein were measured by a Byk Gardner haze meter (all haze values herein are measured by such a haze meter and are given as a percentage of the incident light that is scattered).

"Reflectance" is a term well understood in the art and is used herein according to its well known meaning. For example, the term "reflectance" as used herein means the amount of visible, infrared and ultraviolet light that is reflected by a surface relative to the amount that strikes it.

"Absorptance" is a term well understood in the art and is used herein according to its well known meaning. For example, in a photovoltaic device, absorptance is the ratio of solar energy striking the absorber that is absorbed by the absorber to that of solar energy striking a blackbody (perfect absorber) at the same temperature.

"Emissivity" (or emittance) (E) is a measure, or characteristic of reflectance of light at given wavelengths and is represented by the formula: $E = 1 - \text{Reflectance}_{film}$ for infrared wavelengths. The actual accumulation of data for measurement of such emissivity values is conventional and known to those of skill in this art and may be done by using, for example, a Beckman Model 4260 spectrophotometer with "VW" attachment (Beckman Scientific Inst. Corp.). This spectrophotometer measures reflectance versus wavelength and from this, emissivity can be calculated using standard equations known to those of skill in this art.

"Transmittance" is a term well understood in the art and is used herein according to its well known meaning. The term transmittance herein is made up of visible, infrared and ultraviolet energy transmittance, but may refer to wavelengths specific to power production of a photovoltaic cell.

"Sheet resistance" ($R_s$) is a well known term in the art and is used herein in accordance with its well known meaning. It is reported herein in ohms per square units. Generally speaking, this term refers to the resistance in ohms for any square of a layer system on a glass substrate to an electric current passed through the layer system. For architectural purposes, the sheet resistance is an indication of how well the layer or layer system is reflecting infrared energy, and is thus often used along with emissivity as a measure of this characteristic. For photovoltaic purposes, sheet resistance indicates the ability of the coating to transfer the electrical changes in order to pick up the generated energy. It may be measured by using a 4-point probe ohmmeter, such as a 4-point resistivity probe with a Magnetron Instruments Corp. head, Model M-800 produced by Signatone Corp. of Santa Clara, Calif. A geometric correction factor (CF) is usually required to convert the voltage/current ratio measured by the 4-point probe into sheet resistance. This correction factor accounts for the sample size, shape and probe spacings. The sheet resistance measure by the probe is given by:

$$Rs=(V/I)*CF$$

where V is the measured DC voltage across the two voltage probes and I is the DC current passing through the two current probes. The value of CF for samples of various sizes and shapes can usually be found in a reference book.

"Bulk Resistivity," or electrical resistivity ($\rho$) is a measure of how strongly a material opposes the flow of electric current and is reported herein in units of $10^{-4} \times \Omega*cm$. A low resistivity indicates a material that readily allows the movement of electrical charge. Conversely, a high resistivity indicates a material that does not readily allow the movement of electrical charge.

"Charge carrier density," or carrier density (n), denotes the number of charge carriers per volume and is reported herein in units of $10^{20} \times cm^{-3}$.

"Charge carrier mobility," or mobility ($\mu$) as used herein, is defined as a quantity relating the drift velocity of charge carriers to the applied electric field across a material and reported in units of $cm^2/V*s$. In the case of the TCO of the present invention, the charge carrier mobility is to be considered equivalent to the electron mobility.

"Photovoltaic energy conversion efficiency," or simply efficiency ($\eta$), is defined as the percentage of power converted (from absorbed light to electrical energy) and collected, when a photovoltaic cell is connected to an electrical circuit. The efficiency is reported in percentages and is calculated using the ratio of maximum power ($P_m$) divided by the input light irradiance under "standard" test conditions (E, in $W/m^2$) and the surface area of the solar cell ($A_c$ in $m^2$), according to the formula: $\eta=P_m/(E*A_c)$.

"Short circuit current" ($J_{sc}$) is defined herein as the current flowing freely through an external circuit that has no load or resistance and is reported in milliamps per square centimeter, $mA/cm^2$.

"Open circuit voltage" ($V_{oc}$) is defined herein as the difference in potential between the terminals of a cell; i.e. the voltage when the circuit is open (no-load condition). In the case of a photovoltaic cell, the open-circuit voltage is the maximum possible voltage across the cell; i.e., the voltage across the cell in sunlight when no current is flowing. Open circuit voltages are reported in volts, V.

Asahi's "VU20" is a transparent conductive oxide that is the industry reference as the best fluorine doped tin oxide TCO available for thin film silicon photovoltaic modules. Asahi's VU20 has the unique property in that conductivity can be improved post-production without a significant change in transmission. VU20 is produced in an offline vapor deposition coater. VU20 can be given a post-deposition treatment of inert or reducing gas at an elevated temperature that results in a significant improvement in electron mobility with virtually no change in transmission. The VU20 TCO is comprised of a titania/silica ($TiO_2/SiO_2$) undercoat with fluorine doped tin oxide as the conductive layer.

The inventors of the subject matter of the present invention have previously attempted online TCO film deposition and targeted post-production increases in electrical conductivity of previously known TCO thin films. These methods were analogous to methods used for offline post-production increases in electrical conductivity. However, these attempts were not found to be reproducible. Methods of improving electrical properties of TCO thin films vapor deposited on glass, post-production, has not been realized until the present invention.

The inventors of the subject matter disclosed herein have surprisingly found that using oxidizing chemical additives, other than water, air or oxygen, while pyrolytically depositing a TCO thin film on glass can lead to an increased electrical conductivity of the TCO thin film after the TCO thin film has been vapor deposited, i.e., post-production. Thus, a TCO thin film with this property is desirable for incorporation into PV modules. Non-limiting examples of TCO thin films that may be made by methods in accordance with the present invention are indium tin oxide, tin oxide, fluorine doped tin oxide, aluminum doped zinc oxide and zinc tin oxide. Non-limiting examples of systems described herein utilize fluorine doped tin oxide as the TCO thin film.

More specifically, the inventors have found that addition of an oxidizing chemical additive, other than water, air or oxygen, to the pyrolytic vapor deposition process when producing online TCO thin films onto glass may allow for a post-production increase in the electrical conductivity of the TCO thin film. Methods disclosed herein for post-production improvement of TCO thin films on glass are also applicable to offline produced TCO thin films on glass. Such adaptations to offline methods will be recognized by those of skill in the art.

Non-limiting examples of suitable oxidizing chemical additives may be oxygen, ozone, hydrogen peroxide and other peroxides, nitric acid, ammonium nitrate and other nitrates, nitrites, nitrous oxide, sulfuric acid, sulfates and per-sulfates, hypochloric acid, chlorates, per-chlorates, bromates and borates.

In a further aspect of the present invention, a glass substrate/thin film production method that allows for online post-production improvement in the electrical conductivity of the deposited TCO thin film with substantially no decrease in the transmittance of the TCO thin film is provided.

In a preferred aspect of the invention, an oxidizing chemical other than water, air or oxygen, is added during the pyrolytic vapor deposition and results in a TCO thin film coating that is susceptible to post-production electrical conductivity improvement by improving the electron mobility with virtually no measurable change in light transmission. The change in light transmission is in the range of measurement accuracy ~0.2%. By vapor depositing a TCO thin film in the presence of an oxidizing chemical additive, the optical properties of the tin oxide thin film may also be improved.

Moreover, the oxidizing chemical additive allows for post-production improvement in the electrical conductivity of the TCO when exposed to a non-oxidizing, or slightly reducing, atmosphere at elevated temperature and allowed to cool to ambient temperature under the non-oxidizing atmosphere. Non-limiting examples of suitable non-oxidizing, or slightly reducing, atmospheres are vapors of alcohol, $C_1$-$C_8$ alkyl, carbon monoxide, hydrogen, nitrogen, helium, argon, krypton, neon, xenon, vacuum, reducing plasmas and combinations thereof.

For the transparent conductive oxide of the present invention, it is preferable to dispose an undercoating below the transparent conductive oxide thin film such that the undercoating is positioned between the substrate and the transparent conductive oxide thin film. An undercoating film can serve numerous purposes. The undercoating can serve to prevent an alkaline component contained in a substrate, i.e., glass, from thermally diffusing into a thin film disposed above the undercoating. Also, an undercoating can serve to strengthen the bond of the substrate to a thin film at such sufficient strengths that the characteristics of the thin film do not easily degrade. Furthermore, an undercoating can also serve to provide a desired index of refraction, acting as a color suppression layer such that interference colors originating from a thin film or a substrate can be reduced.

For the undercoating layer of the present invention, it is preferred to use a thin film that contains silicon. More preferably, the undercoating thin film contains silicon and oxygen. Preferred undercoating layers can be, but are not limited to, silicon oxide, silicon dioxide, silicon nitride, silicon oxynitride, silicon carbide, silicon oxycarbide and combinations thereof. An undercoating of the present invention illustrated herein is a silicon oxycarbide thin film. Without wishing to be bound by any theory, it is believed that undercoatings containing silicon lead to an optimal crystal growth of transparent conductive layers based on tin oxide, i.e., columnar crystal growth. To reach the color suppression, the SiO2 layer can be advantageously combined with a high index layer, to produce a double undercoat as $SnO_2/SiO_2$ or $TiO_2/SiO_2$.

Vapor deposition of silicon oxycarbide layers is well-known in the thin film coating arts. A silicon oxycarbide undercoating utilized in the present invention can be pyrolytically vapor deposited from starting materials such as silane ($SiH_4$), carbon dioxide ($CO_2$), ethylene ($C_2H_4$) and nitrogen (carrier gas) at elevated temperatures, preferably in the range of 400° C.-800° C. Most preferably, the elevated glass substrate temperatures are in the range 650° C.-750° C.

The thickness of the undercoating thin film of the present invention is not particularly limited. A preferred thickness is a thickness in the range of 400 Å to 1000 Å thick. More preferably, the thickness of the undercoating thin film is 600 Å to 900 Å. Most preferably, the thickness of the undercoating thin film is 700 Å to 800 Å. Silicon oxycarbide undercoatings of the present invention in the thickness ranges above can lead to color suppression of the color originating from tin oxide iridescence.

Other silicon containing starting materials are also usable within the scope of the present invention. Other well-known silicon containing starting materials include, but are not limited to, disilane, trisilane, monochlorosilane, dichloro-silane, 1,2-dimethylsilane, 1,1,2-trimethyldisilane and 1,1,2,2-tetramethyldisilane. When using silanes as starting materials, it is common to include oxidizing materials in the gaseous stream. The oxidizing materials can be oxygen, water vapor, air, carbon dioxide, carbon monoxide, nitrogen dioxide, and ozone. When silane is used as a starting material, an unsaturated hydrocarbon gas, such as ethylene, acetylene, or toluene, may be added to the gaseous stream to prevent the silane starting material from reacting before reaching the substrate surface.

The fluorine doped tin oxide transparent conductive oxide film of the present invention can be made by pyrolytic deposition methods known to those of ordinary skill in the thin film arts. This process can employ a number of well-known starting materials and precursors to arrive at the final thin film transparent conductive oxide product.

Tin precursors for thin film coatings made by pyrolytic deposition processes of the present invention are conventional and well-known in the art. An especially suitable tin precursor is monobutyltin-trichloride dichloride. This substance is well-known and readily available, and is commonly used as a tin precursor for deposition of tin containing thin films coatings on flat glass. Other tin precursors are also usable within the scope of the present invention. Other well-known tin precursors include, but are not limited to, dimethyltin dichloride, dibutyltin dichloride, tetramethyltin, tetrabutyltin, dioctyltin dichloride, dibutyltin diacetate and tin tetrachloride.

Fluorine doping of tin oxide thin films is also well-known to those of ordinary skill in the thin film coating arts. To accomplish this, a fluorine containing starting material may be added to the gas stream with the tin containing starting material. Non-limiting examples of the fluorine containing starting materials include fluorine gas, hydrogen fluoride, nitrogen trifluoride, trifluoroacetic acid, bromo-trifluoromethane, difluoroethane and chlorodifluoromethane.

A fluorine doped tin oxide transparent conductive oxide coating of the present invention may be pyrolytically vapor deposited from such starting materials as monobutyl tin trichloride ($C_4H_9SnCl_3$), trifluoroacetic acid ($CF_3CO_2H$), air, steam and an additional oxidizing chemical additive other than water, air or oxygen at elevated temperatures. Preferably, the elevated temperatures for the pyrolytically vapor deposition step are in the range of 400° C.-800° C. Most preferably, the elevated temperatures are in the range 550° C.-750° C.

The thickness of the transparent conductive oxide thin film coating of the present invention is preferably 300 nm to 1300 nm thick. More preferably, the thickness of the transparent conductive oxide thin film coating is 400 nm to 1100 nm. Most preferably, the thickness of the transparent conductive oxide thin film coating is 500 nm to 1000 nm.

The following description provides a general method of providing an undercoating and transparent conductive oxide thin film of the present invention. The following description is intended to be non-limiting and modifications and variations of the generally described method can be adapted and changed for a desired final product by those of ordinary skill in the thin film coating arts, such changes still falling within the scope of the present invention.

Soda-lime silica glass made from well-known glass batch compositions can be melted by heating in a glass melting furnace. The temperatures required for such glass batch melting is typically from about 1500° C. to 1600° C. After melting to create a molten glass, the molten glass is poured into a float bath of molten tin, from which the glass is rolled out to form a glass ribbon. The glass ribbon typically has a temperature of about 600° C. to 1100° C. in the float bath of molten tin. The glass ribbon cools as it is moved away from the glass melting furnace. In the area on the float-line where the undercoating and transparent conductive oxide thin films of the present invention are pyrolytically deposited, the temperature of the glass ribbon is typically about 500° C. to 800° C.

From a first coater positioned in a float bath, the undercoating of the present invention can be pyrolytically deposited. A mixed gas stream containing silane ($SiH_4$), carbon dioxide ($CO_2$), ethylene ($C_2H_4$) and nitrogen (carrier gas) can be directed to a heated surface of the glass ribbon for creation and deposition of a silicon oxycarbide thin film undercoating. The gases of the mixed gas stream included in each of the aforementioned starting materials can be supplied at the following rate ranges: 1) silane ($SiH_4$) 2.0-40.0 g/min; 2) carbon dioxide ($CO_2$) 50.0-300.0 g/min; 3) ethylene ($C_2H_4$) 0.0-110.0 g/min; and 4) nitrogen (carrier gas) 0.0-200.0 g/min. Preferred ranges for the delivery of starting materials are: 1) silane ($SiH_4$) 15.0-25.0 g/min; 2) carbon dioxide ($CO_2$) 150.0-200.0 g/min; 3) ethylene ($C_2H_4$) 6.8-88.0 g/min; and 4) nitrogen (carrier gas) 30.0-60.0 g/min.

From a second coater positioned downstream from a first coater, the transparent conductive oxide thin film of the present invention can be pyrolytically deposited. A mixed gas stream containing monobutyl tin trichloride ($C_4H_9SnCl_3$), trifluoroacetic acid ($CF_3CO_2H$), air, steam, oxygen and nitric acid ($HNO_3$— oxidizing chemical additive) can be directed to a surface of the undercoating for creation and deposition of a fluorine doped tin oxide transparent conductive oxide thin film. As will be recognized by those of ordinary skill in the art, it will sometimes be necessary to employ a solvent to aid in keeping the tin containing starting material in solution to help control volatility of the tin containing starting material as well as to prevent the starting materials of the gas mixture from reacting with each other. Well known solvents for accomplishing this are lower ($C_1$-$C_5$) dialkyl ketones, such as acetone, diethyl ketone, methyl isobutyl ketone and methyl ethyl ketone. A preferred lower dialkyl ketone of the present invention is methyl isobutyl ketone. In the case where the gases are delivered individually, or separately, to a heated surface, such solvents are not necessary, but can be employed, if desired.

The introduction of an oxidizing chemical other than water, air or oxygen, can be carried out by methods known to those of skill in the art. A non-limiting example of introducing the oxidizing chemical is mixing the vapor of the oxidizing chemical with the pyrolytic vapor prior to exposure to a TCO coater. Another non-limiting example of introduction of the oxidizing chemical is applying the oxidizing chemical vapor in front of a TCO coater.

The gases of the mixed gas stream included in each of the aforementioned starting materials can be supplied at the following rates: 1) 0.20-2.00 kg/min of a mixture containing 70%-95% of monobutyl tin trichloride, 5%-20% trifluoroacetic acid and 0%-15% methyl isobutyl ketone; 2) 0.00-5.00 kg/min of water vapor; 3) 0.00-2.00 kg/min of air; and 4) 0.20-1.50 kg/min of an aqueous solution of 60%-80% nitric acid Preferred ranges for the delivery of starting materials are: 1) 0.20-2.00 kg/min of a mixture containing 88%-92% of monobutyl tin trichloride, 8%-12% trifluoroacetic acid and 0%-15% methyl isobutyl ketone; 2) 0.00-2.5 kg/min of water vapor; 3) 0.00-2.00 kg/min of air; and 4) 0.60-0.80 kg/min of an aqueous solution of 60%-80% nitric acid.

After deposition of the undercoating and transparent conductive oxide thin film of the present invention on glass ribbon, the glass/undercoating/TCO system is then cooled to ambient temperature in a non-oxidizing, or slightly reducing, atmosphere from elevated temperatures. Non-limiting examples of suitable non-oxidizing, or slightly reducing, atmospheres for cooling to ambient temperature are vapors of alcohols, $C_1$-$C_8$ alkyl, carbon monoxide, hydrogen, nitrogen, helium, argon, krypton, neon, xenon, vacuum, reducing plasmas and combinations thereof. For the methods of the present invention, a nitrogen atmosphere was employed. Hence, the glass/undercoating/TCO system described herein is cooled to ambient temperature under a nitrogen atmosphere, whereby the post-production increase of electrical conductivity of at least 2% of the transparent conductive oxide thin film is realized. It should be noted that the electrical conductivity improvement can alternatively be expressed either by a sheet resistance decrease or as an electron mobility increase. The at least 2% increase in electrical conductivity is observed when compared to glass/undercoating/TCO systems that are either not vapor deposited in the presence of an oxidizing chemical additive (other than water, air or oxygen) or, after vapor deposition, not cooled to ambient temperature under a non-oxidizing, or slightly reducing, atmosphere. The creation of a non-oxidizing, or slightly reducing, atmosphere for cooling the glass/undercoating/TCO system of the present invention to ambient temperature will be known to those of ordinary skill in the thin film coating arts.

Elevated temperatures for carrying out the non-oxidizing treatment from which the inventive coated systems are cooled to ambient temperature are typically between about 200° C. and about 600° C. A preferred temperature range is between about 275° C. and about 450° C. A most preferred temperature range is between about 350° C. and about 400° C. Cooling can be carried out in a belt furnace or other equipment recognized by those of ordinary skill the art. Inventive systems are passed through a belt furnace at a conveyance speed of preferably about 1 meter/minute (m/min) to about 35 m/min. A more preferable conveyance speed is about 5 m/min to about 25 m/min. A most preferred conveyance speed is about 10 m/min to about 15 m/min. The cooling time can be anywhere from, preferably, a minute to ten minutes. More preferably, the cooling time can be a minute to five minutes. Most preferably, the cooling time is three minutes to four minutes. Determination of other parameters of the cooling process described herein will be recognized and appreciated by those of skill in the art.

Alternatively, the inventors of the present invention have also found that the glass/undercoating/TCO systems of the present invention do not necessarily have to be cooled to ambient temperature under a non-oxidizing, or slightly reducing, atmosphere immediately after vapor deposition of the TCO layer in the presence of an oxidizing chemical additive to realize a post-production electrical conductivity increase of at least 2%. For example, the inventive system, after vapor deposition of the TCO layer, can be cooled to ambient temperature under ambient conditions. However, doing this will not result in the at least preferred 2% post-production increase in electrical conductivity of the TCO layer. To realize the at least 2% post-production increase in electrical conductivity, the inventive system that has been cooled to ambient temperature under ambient conditions can be re-heated to elevated temperatures and then cooled to ambient temperature under a non-oxidizing, or slightly reducing, atmosphere. Methods of carrying out such an alternative treatment will be known and recognized to those of ordinary skill in the art.

EXAMPLE 1

From a first coater positioned inside a float bath, a mixed gas stream containing silane ($SiH_4$), carbon dioxide ($CO_2$), ethylene ($C_2H_4$) and nitrogen ($N_2$-carrier gas) was directed to a heated surface of the glass ribbon. The gases of the mixed gas stream included the starting materials supplied at the following rate ranges: 1) silane ($SiH_4$) 13.5 gm/min; 2) carbon dioxide ($CO_2$) 150.0 gm/min; 3) ethylene ($C_2H_4$) 6.0 gm/min; and 4) nitrogen (carrier gas) 38.0 gm/min.

From a second coater positioned downstream from a first coater, a mixed gas stream containing monobutyl tin trichloride ($C_4H_9SnCl_3$), trifluoroacetic acid ($CF_3CO_2H$), air, steam and nitric acid ($HNO_3$— oxidizing chemical additive) was directed to a surface of the undercoating. The gases of the mixed gas stream included the starting materials supplied at the following rate ranges: 1) 0.98 kg/min of a mixture containing 93% monobutyl tin trichloride, 5% trifluoroacetic acid and 2% methyl isobutyl ketone; 2) 0.85 kg/min of water vapor; 3) 0.88 kg/min of air; and 4) 0.78 kg/min of an aqueous solution of 67.2% nitric acid.

After deposition of the undercoating and transparent conductive oxide thin film, the glass/undercoating/TCO system is exposed to a nitrogen atmosphere at an elevated temperature. The elevated temperature of the glass/undercoating/TCO system is about 375° C. when entering a belt furnace. The glass/undercoating/TCO system passes through the belt furnace for four minutes at a conveyance speed of about 10 m/min to about 15 m/min. The glass/undercoating/TCO system is cooled to ambient temperature under a nitrogen atmosphere, thereby producing a transparent conductive oxide with improved electrical and optical properties.

EXAMPLE 2

From a first coater positioned inside a float bath, a mixed gas stream containing silane ($SiH_4$), carbon dioxide ($CO_2$), ethylene ($C_2H_4$) and nitrogen ($N_2$-carrier gas) was directed to a heated surface of the glass ribbon. The gases of the mixed gas stream included the starting materials supplied at the following rate ranges: 1) silane ($SiH_4$) 13.5 gm/min; 2) carbon dioxide ($CO_2$) 150.0 gm/min; 3) ethylene ($C_2H_4$) 5.0 gm/min; and 4) nitrogen (carrier gas) 38.0 gm/min.

From a second coater positioned downstream from a first coater, a mixed gas stream containing monobutyl tin trichloride ($C_4H_9SnCl_3$), trifluoroacetic acid ($CF_3CO_2H$), air, steam and nitric acid ($HNO_3$— oxidizing chemical additive) was directed to a surface of the undercoating. The gases of the mixed gas stream included the starting materials supplied at the following rate ranges: 1) 1.00 kg/min of a mixture containing 81% monobutyltin trichloride, 15% trifluoroacetic acid and 4% methyl isobutyl ketone; 2) 0.80 kg/min of water vapor; 3) 0.63 kg/min of air; and 4) 0.90 kg/min of an aqueous solution of 67.2% nitric acid.

After deposition of the undercoating and transparent conductive oxide thin film, the glass/undercoating/TCO system is exposed to a nitrogen atmosphere at an elevated temperature. The elevated temperature of the glass/undercoating/TCO system is about 375° C. when entering a belt furnace. The glass/undercoating/TCO system passes through the belt furnace for four minutes at a conveyance speed of about 10 m/min to about 15 m/min. The glass/undercoating/TCO system is cooled to ambient temperature under a nitrogen atmosphere, thereby producing a transparent conductive oxide with improved electrical and optical properties.

EXAMPLE 3

From a first coater positioned inside a float bath, a mixed gas stream containing silane ($SiH_4$), carbon dioxide ($CO_2$), ethylene ($C_2H_4$) and nitrogen ($N_2$-carrier gas) was directed to a heated surface of the glass ribbon. The gases of the mixed gas stream included the starting materials supplied at the following rate ranges: 1) silane ($SiH_4$) 15.0 gm/min; 2) carbon dioxide ($CO_2$) 200.0 gm/min; 3) ethylene ($C_2H_4$) 13.3 gm/min; and 4) nitrogen (carrier gas) 33.3 gm/min.

From a second coater positioned downstream from a first coater, a mixed gas stream containing monobutyl tin trichloride ($C_4H_9SnCl_3$) and trifluoroacetic acid ($CF_3CO_2H$) were directed to a surface of the undercoating. Furthermore, air, steam and nitric acid ($HNO_3$— oxidizing chemical additive) added and mixed to the gas stream above. The gases monobutyl tin trichloride and trifluoroacetic acid were supplied as a mixture at the rate of 1.8 kg/min containing 91.9% monobutyltin trichloride and 8.1% trifluoroacetic acid. Air, steam and nitric acid were added to the gases of monobutyl tin trichloride and trifluoroacetic acid for forming the $F:SnO_2$ transparent conductive oxide thin film at the following rates: 1) 2.31 kg/min of water vapor; 2) 3.4 kg/min of air; and 3) 0.56 kg/min of an aqueous solution of 67% nitric acid.

After deposition of the undercoating and transparent conductive oxide thin film, the glass/undercoating/TCO system is exposed to a nitrogen atmosphere at an elevated temperature. The elevated temperature of the glass/undercoating/TCO system is about 375° C. when entering a belt furnace. The glass/undercoating/TCO system passes through the belt furnace for four minutes at a conveyance speed of about 10 m/min to about 15 m/min. The glass/undercoating/TCO system is cooled to ambient temperature under a nitrogen atmosphere, thereby producing a transparent conductive oxide with improved electrical and optical properties.

The transparent conductive oxide thin films made by methods of the present invention produce thin films that demonstrate an increased electrical conductivity when compared to transparent conductive oxide thin films that are pyrolytically deposited in the absence of an oxidizing chemical additive, such as nitric acid. The electrical and optical properties of transparent conductive oxides made by methods of the present invention will now be discussed below in more detail, with reference to the Figures and Table 1. It should be noted that the representative inventive samples listed above outline a general method of making the inventive samples discussed below.

FIG. 1 shows transmittance, reflectance and absorptance data for online produced TCO thin films provided in accordance with the present invention (e.g., 070808 samples 1-3) as compared to standard, non-oxidatively treated samples referred to as AFG1022 and AFG1119. As can be seen from the graphs, transmittance increased and absorptance decreased for the inventive samples 1-3 as compared to the standards. Also observed was virtually no measurable change, within the accuracy of measurement, ~0.1%, in the reflectance for the 070808 samples 1-3 as compared to the non-acid treated AFG1022 and AFG1119 samples.

Figure 2:
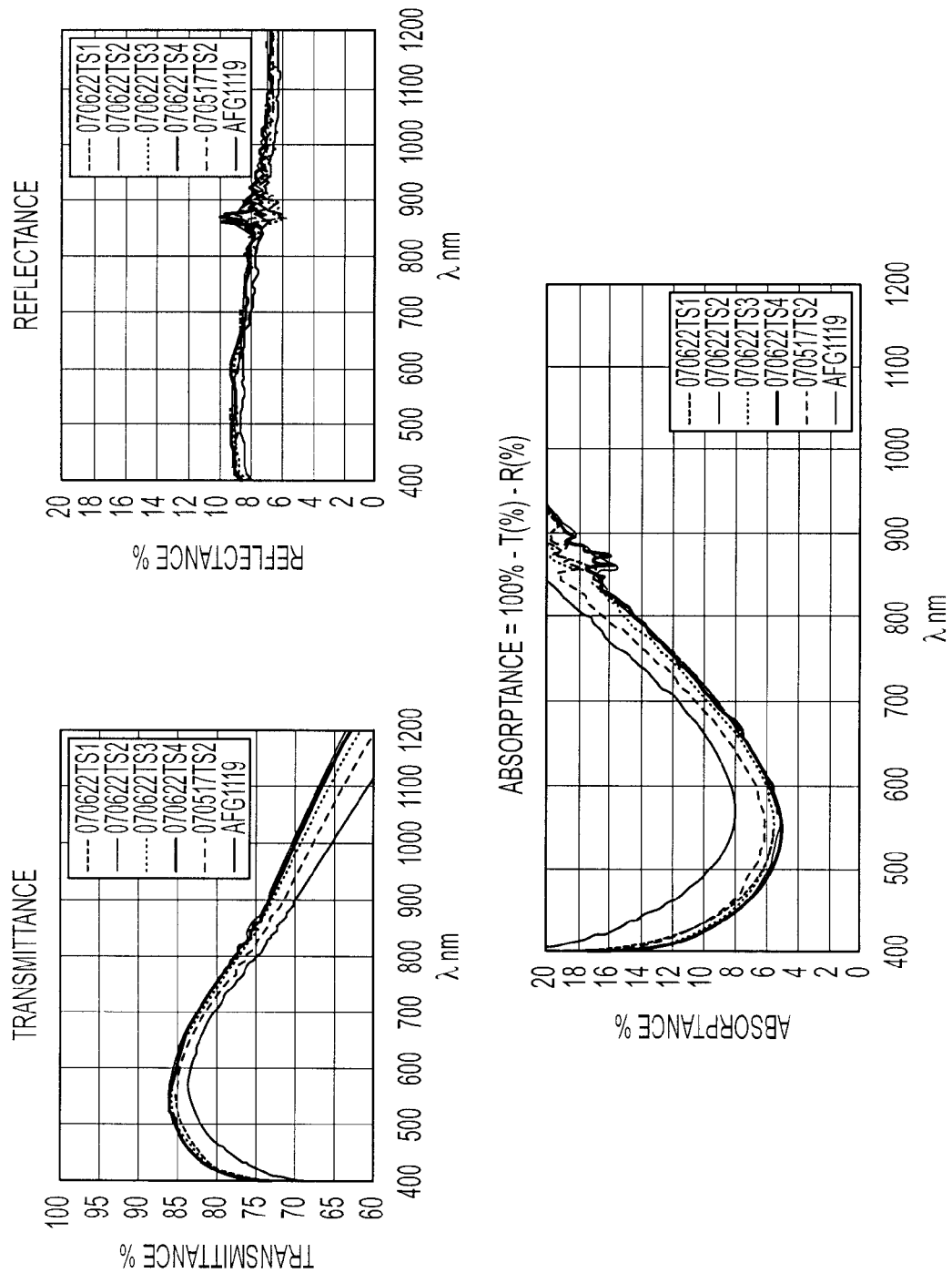
FIG. 2 shows transmittance, reflectance and absorptance data for 070622 samples 1-4 as compared to the standard, non-acid treated AFG1119 sample. Data for 070517 sample 2 is also shown.

FIG. 2 shows transmittance, reflectance and absorptance data for online produced TCO thin films provided in accordance with another aspect of the present invention (e.g., 070622 samples 1-4) as compared to the standard, non-oxidatively treated sample referred to as AFG1119. As can be seen from the graphs, transmittance increased and absorptance decreased for the inventive samples 1-3 as compared to the standards. Also observed was virtually no measurable change, within the accuracy of measurement, ~0.1%, in the reflectance for the inventive samples 1-3 as compared to the standards.

Table 1 lists optical and electrical property data for online produced TCO's 070808, samples 1-3, 070622 samples 1-4 and for standards 1119 and 1022 before the discovered post-production cooling treatment. As can be seen, the oxidatively treated TCO's 070808, samples 1-3, and 070622, samples 1-4, show a decreased haze percentage compared to the standard, non-oxidatively treated 1119 and 1022 TCO's. It is believed that this is mostly due to film thickness instead of oxidative chemical addition. It is noted that the transmission curves described in FIGS. 1 and 2 are made by immersion methods, while the transmission values listed in Table 1 are obtained with a haze meter and are not directly comparable to the transmission values obtained by the transmission curves of FIGS. 1 and 2. Different methods of measuring transmission values are well known to those of ordinary skill in the art.

TABLE 1

Optical and Electrical Properties for systems 070808 (samples 1-3), 060622 (samples 1-4) and standards 1119 and 1022.

| Sample-nitric acid test | Haze % | Tt % | $SnO_2$ thickness-nm | $R_s$ $\Omega * m$ | $\rho$ $\times 10^{-4} \Omega * cm$ | $\eta$ $\times 10^{20} cm^{-3}$ | $\mu$ $cm^2/Vs$ |
|---|---|---|---|---|---|---|---|
| 070808#1 (1022) | 11.1 | 82.1 | 550 | 13.5 | 7.5 | 2.91 | 28.8 |
| 070808#2 (1022) | 12.9 | 81.1 | 650 | 13.8 | 9.0 | 2.73 | 25.5 |

TABLE 1-continued

Optical and Electrical Properties for systems 070808 (samples 1-3), 060622 (samples 1-4) and standards 1119 and 1022.

| Sample-nitric acid test | Haze % | Tt % | $SnO_2$ thickness- nm | $R_s$ $\Omega * m$ | $\rho$ $\times 10^{-4} \Omega * cm$ | $\eta$ $\times 10^{20} cm^{-3}$ | $\mu$ $cm^2/Vs$ |
|---|---|---|---|---|---|---|---|
| 070808#3 (1022) | 13.2 | 81.7 | 613 | 14.3 | 8.8 | 2.64 | 27.1 |
| 070622#1 (1119) | 12.3 | 80.7 | 504 | 10.8 | 5.4 | 3.66 | 31.5 |
| 070622#2 (1119) | 11.6 | 81.2 | 539 | 10.4 | 5.6 | 3.70 | 30.3 |
| 070622#3 (1119) | 10.0 | 81.3 | 563 | 9.1 | 5.1 | 3.78 | 32.2 |
| 070622#4 (1119) | 10.9 | 81.4 | 601 | 9.2 | 5.5 | 3.71 | 30.5 |
| PVTCO1119 | 13.8 | 78.2 | 611 | 10.3 | 6.3 | 3.42 | 29.2 |
| PVTCO1022 | 16.2 | 78.5 | 650 | 13.1 | 8.5 | 2.31 | 31.6 |
| As defined in Example 3 | 10.8 | 79.9 | 937 | 8.9 | 8.4 | 2.79 | 26.7 |

An increased light transmittance of at least about 2% is also observed for the oxidatively treated inventive samples when compared to the non-oxidatively treated standards. It is believed that the increase in light transmission for the oxidatively treated inventive samples is due to a number of factors. Without wishing to be bound by any theory, it is believed that the presence of nitric acid aids in oxidizing any unoxidized tin atoms from the initial deposition step. It is also believed that the presence of nitric acid may help prevent fluorine from being trapped at the grain boundaries. Furthermore, it is believed that the presence of nitric acid aids in forming columnar crystals of the fluorine doped tin oxide layer, thereby changing the nature of the tin oxide layer crystal orientation when compared to a fluorine doped tin oxide layer that has not been deposited in the presence of nitric acid.

It is also observed that the electrical properties of the TCO's that were oxidatively treated, and before being cooled under a nitrogen atmosphere, do not show any trend or correlation with oxidative treatment. For example, the 070808 system (all 3 samples) shows an increase in carrier density, n, and a decrease in electron mobility, μ, when compared to TCO 1022 whereas the 070622 system (all 4 samples) show an increase in carrier density, n, and electron mobility, μ, when compared to TCO 1119. Vapor deposition of the TCO thin films in the presence of an oxidizing chemical additive alone may not be sufficient to achieve the desired improvements in all cases.

Certain embodiments of the present invention include two aspects, with the first being the addition of an oxidizing chemical to the pyrolytic vapor deposition step during online production of the TCO thin film coating, thereby incorporating the oxidizing chemical into the TCO thin film. This aspect may increase the desired optical properties of the TCO thin film, as described above.

Figure 3:
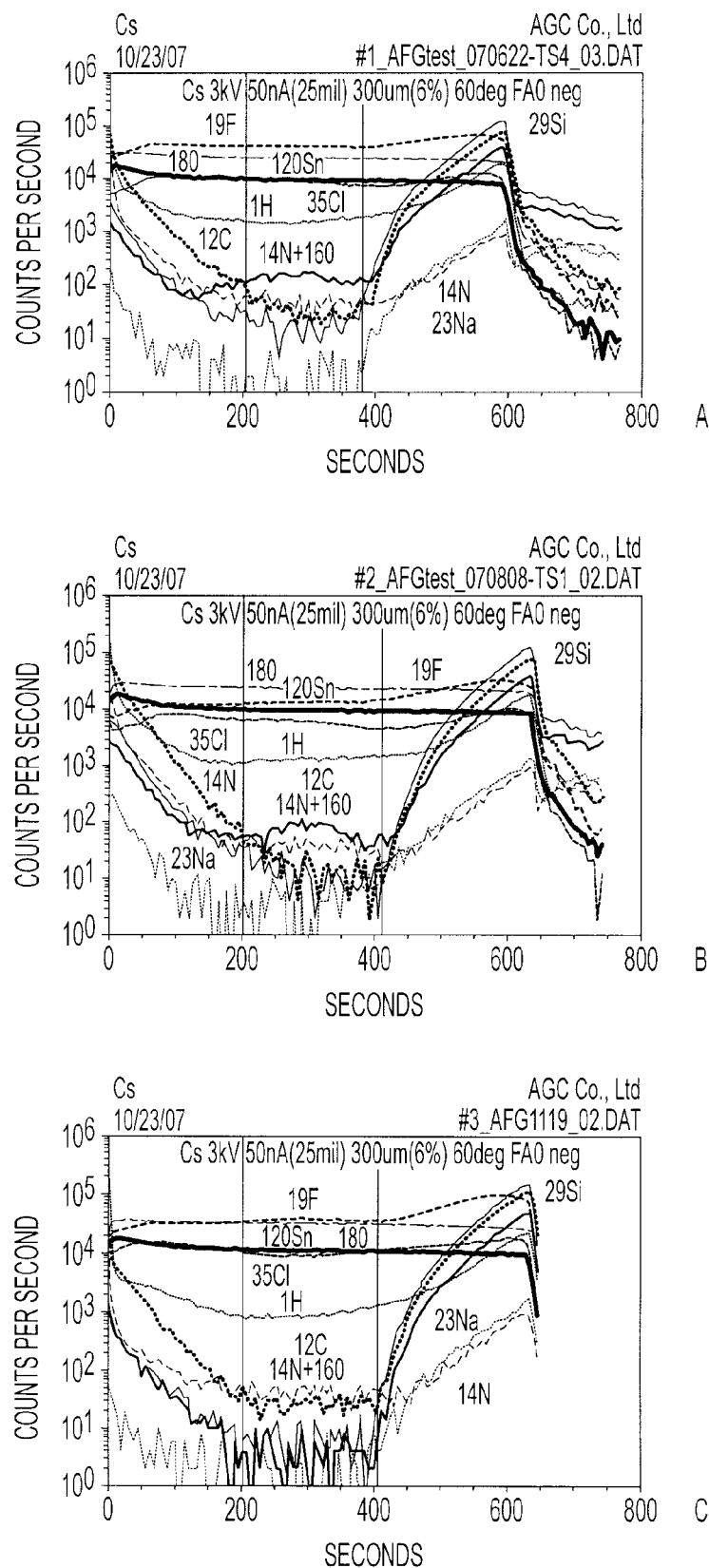
FIG. 3 shows secondary ion mass spectrometry profiles of A) inventive system 070622 sample 4; B) inventive system 070808 sample 1; and C) standard system 1119. For all graphs shown, the vertical line at about 400 second represents the interface of the tin oxide thin film and the foundation.

Without wishing to be bound by any particular theory, Applicants believe that the oxidizing chemical additive is incorporated into the framework of the TCO thin film and that the oxidizing chemical oxidizes at least a portion of the surface of the undercoat layer. FIG. 3 shows Secondary Ion Mass Spectrometry (SIMS) results for inventive systems 070622 sample 4 and 070808 sample 1 compared to standard system 1119. These systems were deposited in the presence of nitric acid. As can be seen, inventive systems 070622 sample 4 and 070808 sample 1 possess a higher nitrogen concentration than the standard 1119. This is consistent with Applicants belief that the oxidizing chemical additive is incorporated into the TCO thin film.

The second aspect is a cooling step of the glass/UC/TCO in a non-oxidizing, or slightly reducing atmosphere, from elevated temperatures. Those of skill in the art will recognize that the online produced TCO thin films on glass can involve a glass cooling step usually referred to as annealing. This glass cooling, or annealing, is not to be confused with the inventive cooling step described herein, whereby the glass/UC/TCO system undergoes cooling to ambient temperature in a non-oxidizing atmosphere from elevated temperature. The desired changes in electrical properties of the TCO thin film are observed when the cooling of the TCO thin films have been vapor deposited in the presence of an oxidizing chemical.

Without wishing to be bound by any particular theory, Applicants believe that this observed increase in TCO thin film electrical conductivity with substantially no change in light transmission is due to an increase in the electron mobility brought about by cooling the oxidatively treated, vapor deposited TCO thin film in a non-oxidizing atmosphere. Furthermore, increased electron mobility permits the use of a reduced carrier density with substantially the same level of electrical conductivity. Thus, a reduced carrier density with substantially the same level of electrical conductivity is believed to lead to better PV device performance and efficiency.

Without wishing to be bound by any particular theory, it is also believed that the methods of making the TCO thin films in accordance with the present invention leads to a change in surface morphology of the thin films (data not shown) in a way that that facilitates light transmission. In other words, the changes in surface morphology brought about by methods of making TCO thin films of the present invention are ideal for photovoltaic devices.

Figure 4:
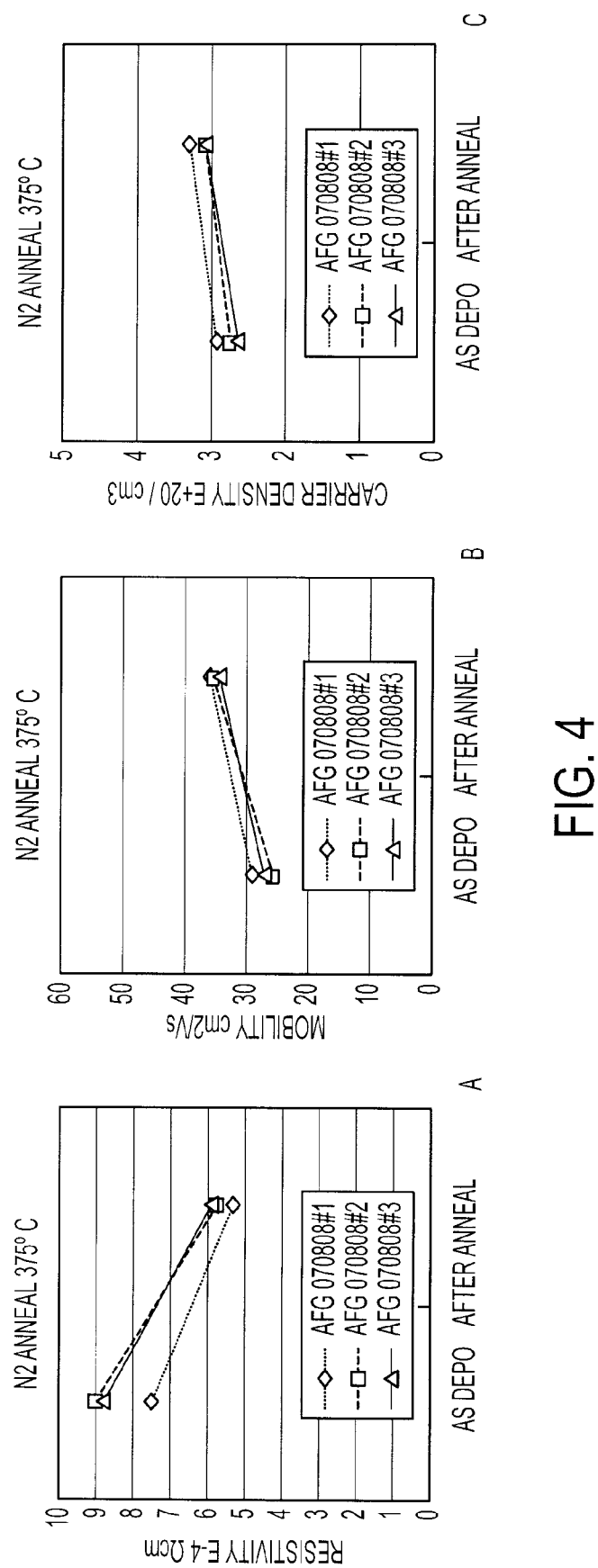
FIG. 4 shows electrical property data for nitrogen cooled, nitric-acid treated TCO 070808 samples 1-3. A) shows resistivity values for the systems as deposited by vapor deposition and after nitrogen cooling from 375° C. B) shows electron mobility values for the systems as deposited by vapor deposition and after nitrogen cooling from 375° C. C) shows carrier density values for the systems as deposited by vapor deposition and after nitrogen cooling from 375° C.

FIG. 4 shows the effect of cooling in a non-oxidizing atmosphere on the electrical properties of online produced TCO 070808, samples 1-3. For this system, the non-oxidizing atmosphere was a nitrogen atmosphere and the cooling treatment was carried out from a beginning temperature of about 375° C. As can be seen, resistivity values decreased for all three samples of the 070808 system after cooling to ambient temperature under a nitrogen atmosphere, while carrier densities and electron mobilities increased for all three samples.

Thus, the nitrogen cooling effect on the electrical properties of the TCO thin film was confirmed for this system.

Figure 5:
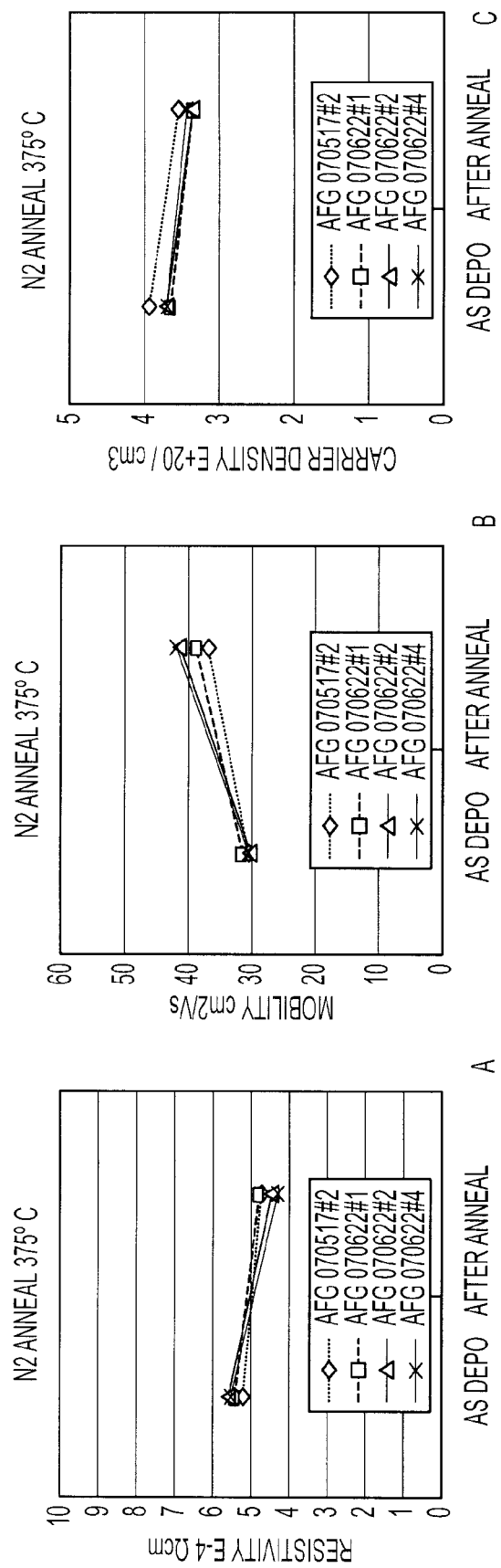
FIG. 5 shows electrical property data for nitrogen cooled, nitric-acid treated TCO 070622 samples 1, 2 and 4. A) shows resistivity values for the systems as deposited by vapor deposition and after nitrogen cooling from 375° C. B) shows electron mobility values for the systems as deposited by vapor deposition and after nitrogen cooling from 375° C. C) shows carrier density values for the systems as deposited by vapor deposition and after nitrogen cooling from 375° C.

FIG. 5 shows the effect of nitrogen cooling on the electrical properties of online produced TCO 070622, samples 1, 2 and 4. Also shown is data from system 070517, sample #2, which has been included. The cooling step was carried out from a beginning temperature of about 375° C. Nitrogen cooling data for this system was carried out at 375° C. in a belt furnace with a conveyance speed of about 10 m/minute. The cooling time was several minutes and a remaining oxygen concentration was estimated at less than 10 ppm.

As can be seen, resistivity values decreased for all three samples of the 070622 system after cooling to ambient temperature under a nitrogen atmosphere, while electron mobility values increased for all three samples. However, the carrier densities for this system showed a slight decrease. Thus, the nitrogen cooling effect on the electrical properties of the TCO thin film was confirmed for this system.

Figure 6:
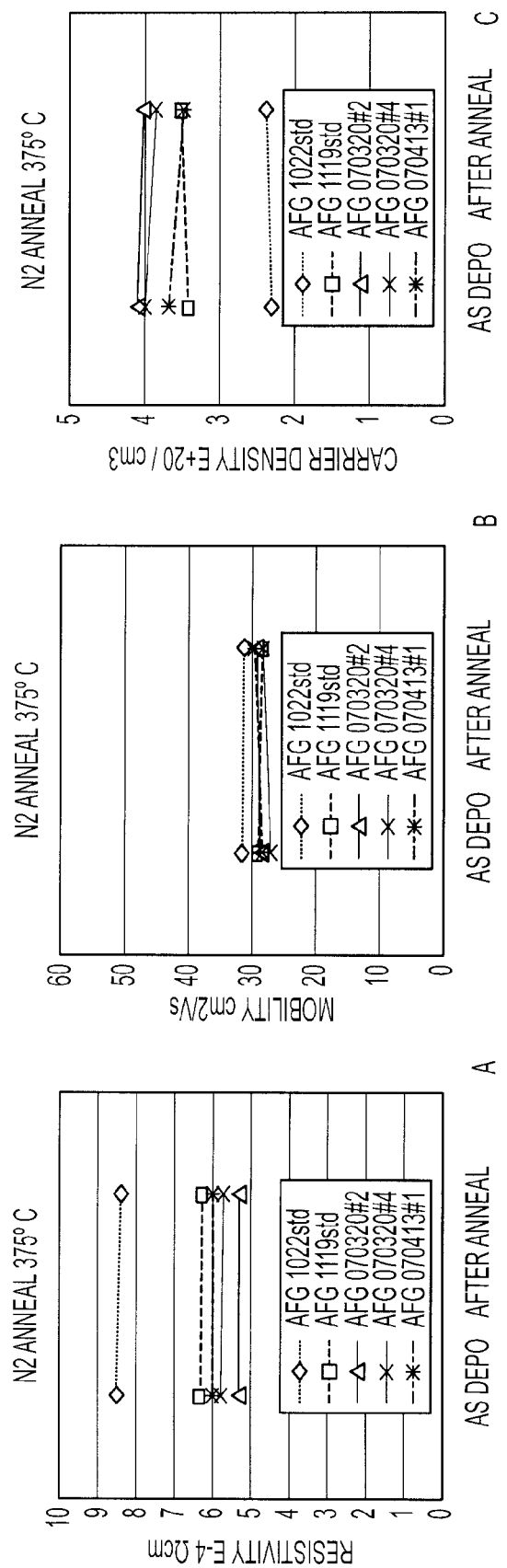
FIG. 6 shows electrical Property data for nitrogen cooled, non-nitric-acid treated AFG1022 and AFG1119 systems. A) shows resistivity values for the systems as deposited by vapor deposition and after nitrogen cooling from 375° C. B) shows electron mobility values for the systems as deposited by vapor deposition and after nitrogen cooling from 375° C. C) shows carrier density values for the systems as deposited by vapor deposition and after nitrogen cooling from 375° C.

FIG. 6 shows the effect of nitrogen cooling on the electrical properties of online produced standards AFG1022 and AFG 1119. Also shown is data from systems 070320 and 070413, which have been included. Nitrogen cooling data for this system was carried out at 375° C. in a belt furnace with a conveyance speed of about 10 m/minute. The cooling time was several minutes and a remaining oxygen density was estimated at less than 10 ppm.

As can be seen, the electrical properties of the TCO thin film standards were substantially unchanged after cooling in a nitrogen atmosphere. It is believed that this is because the thin films of these two standards were not subjected to the inventive oxidative treatment during the vapor deposition process. This data further supports the advantageous use of an oxidizing chemical treatment during the vapor deposition step for online produced TCO thin films on glass because the oxidizing treatment during deposition allows for post-production improvement in electrical conductivity by cooling in the presence of a non-oxidizing atmosphere at suitable temperatures. This post-production improvement in electrical conductivity can be realized when TCO thin films of the present invention have been subjected to an oxidizing chemical additive during the vapor deposition step.

Figure 7:
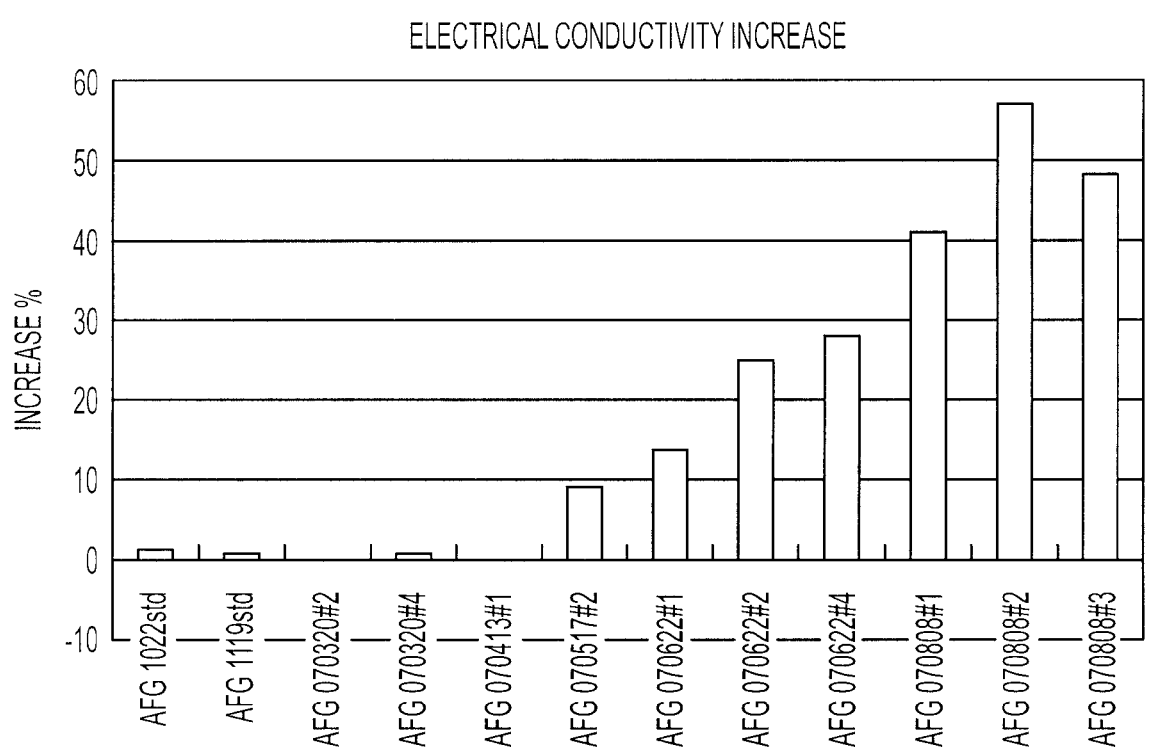
FIG. 7 shows electrical conductivity data for online produced TCO systems 070808, samples 1-3 and 070622, samples 1, 2 and 4 of the present invention as compared to online produced standards AFG 1119 and 1022. The inventive systems were cooled to ambient temperature from 375° C. in a nitrogen atmosphere.

FIG. 7 shows electrical conductivity data for online produced TCO systems 070808, samples 1-3 and 070622, samples 1, 2 and 4 of the present invention as compared to online produced standards AFG 1119 and 1022. Also shown is data from systems 070320, 070413 and 070517, which have been included.

As can be seen, electrical conductivity of online produced TCO inventive systems 070808, samples 1-3 and 070622, samples 1, 2 and 4 increased at least about a 12% after cooling to ambient temperature from elevated temperatures as compared to online produced standards AFG 1119 and 1022. For this data, the cooling was carried out in a nitrogen atmosphere.

The subject matter of the present invention represents, for the first time, an online produced TCO thin film on glass with electrical properties that can be improved post-production.

Methods of incorporating TCO thin films into photovoltaic devices are well-known to those of skill in the art. When TCO thin films of the present invention are incorporated into photovoltaic devices, these photovoltaic devices have efficiencies approaching those of Asahi's offline produced VU20 system.

Figure 8:
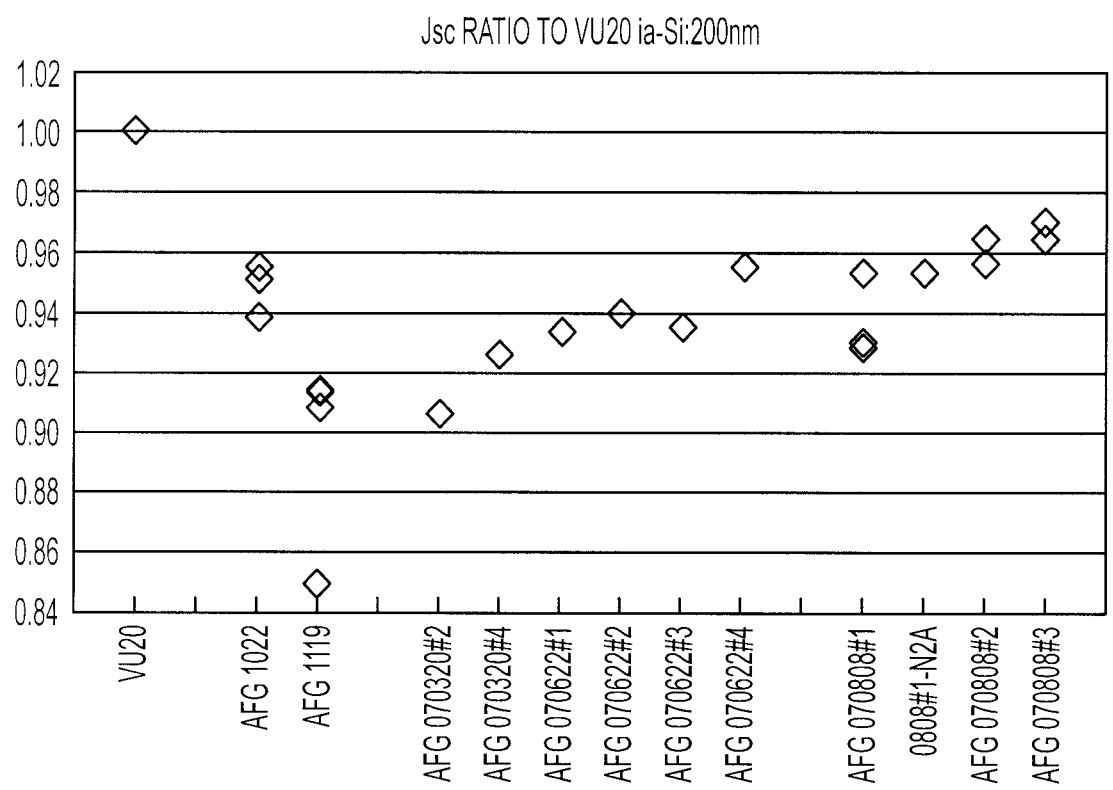
FIG. 8 shows short circuit current comparative data for TCO 070808 and 070622 systems of the present invention as compared to standards AFG 1119 and 1022 as well as Asahi's VU20 system.

FIG. 8 shows short circuit current data for online produced TCO 070808 and 070622 systems of the present invention as compared to online produced standards AFG 1119 and 1022 as well as Asahi's offline produced VU20 system. In this figure, the $J_{sc}$ for Asahi's VU20 system is normalized to a value of unity and all other data is interpreted as a percentage of the VU20 value. Also shown is data for system AFG 070320 samples 2 and 4.

With Asahi's VU20 system normalized to unity, the AFG standards 1119 and 1022 show short circuit current data that are approximately 91% and 95% that of the VU20 system, respectively. TCO systems 070622, samples 1-4 show an increased short circuit current when compared to standard AFG 1119. When compared to standard AFG 1022, only 070808, samples 2 and 3 show a slight increase in short circuit current. The short circuit current data for the remaining 070808 sample 1 does not show a marked increase, if at all, when compared to standard AFG 1022. The increases in short circuit currents, when observed, can be attributed to increases in transmittance for these systems. TCO system 070808, samples 2 and 3 display short circuit currents that are approximately 96% to 97% that of Asahi's VU20 system.

Figure 9:
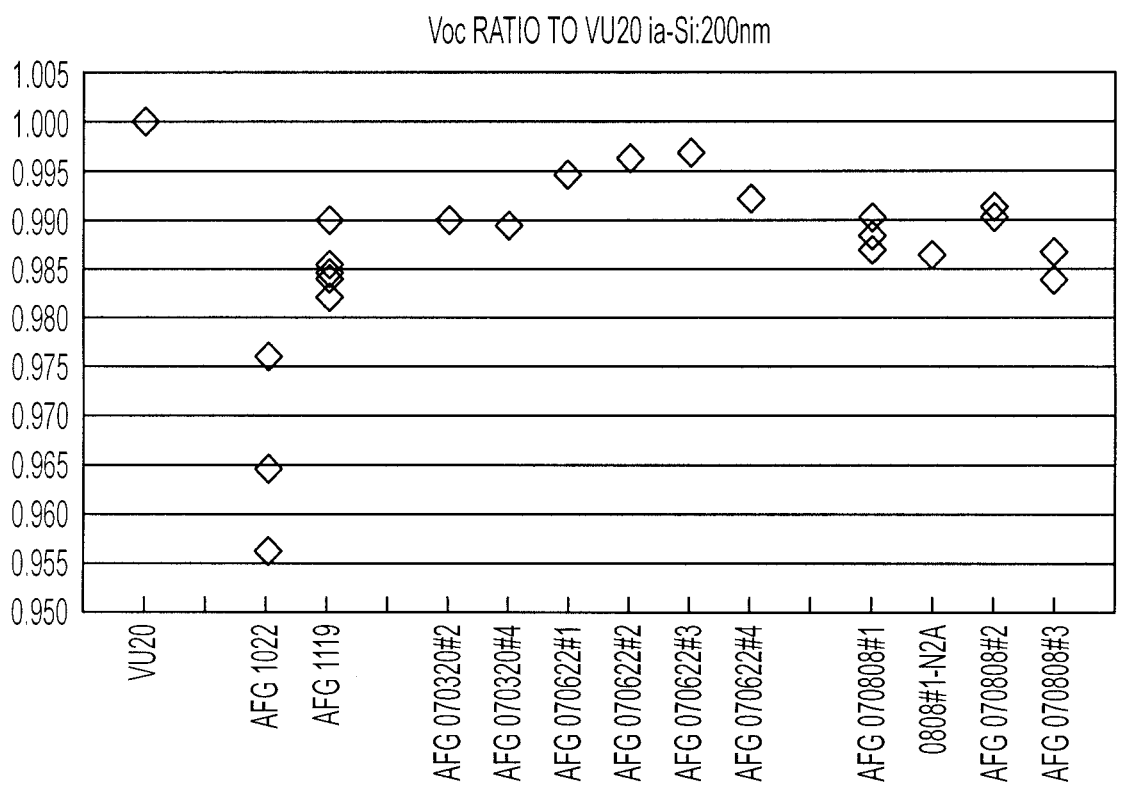
FIG. 9 shows open circuit voltage comparative data for TCO 070808 and 070622 systems of the present invention as compared to standards AFG 1119 and 1022 as well as Asahi's VU20 system.

FIG. 9 shows open circuit voltage data for online produced TCO 070808 and 070622 systems of the present invention as compared to online produced standards AFG 1119 and 1022 as well as Asahi's offline produced VU20 system. In this figure, the $V_{oc}$ for Asahi's VU20 system is normalized to a value of unity and all other data is interpreted as a percentage of the VU20 value. Also shown is data for system AFG 070320 samples 2 and 4.

With Asahi's VU20 system normalized to unity, the AFG standards 1119 and 1022 show open circuit voltage data that are, at best, approximately 99.0% and 97.6% that of the VU20 system, respectively. TCO system 070622, samples 1-4, show an increased open circuit voltage when compared to standard system AFG 1119. TCO system 070808, samples 1-3, show a distinct increase in open circuit voltage when compared to standard system AFG 1022. The increases in open circuit voltages can be attributed to morphological changes of the surface of the TCO thin films (data not shown). TCO system 070622, samples 1-3, display open circuit voltages that are approximately 99.6% that of Asahi's VU20 system.

Figure 10:
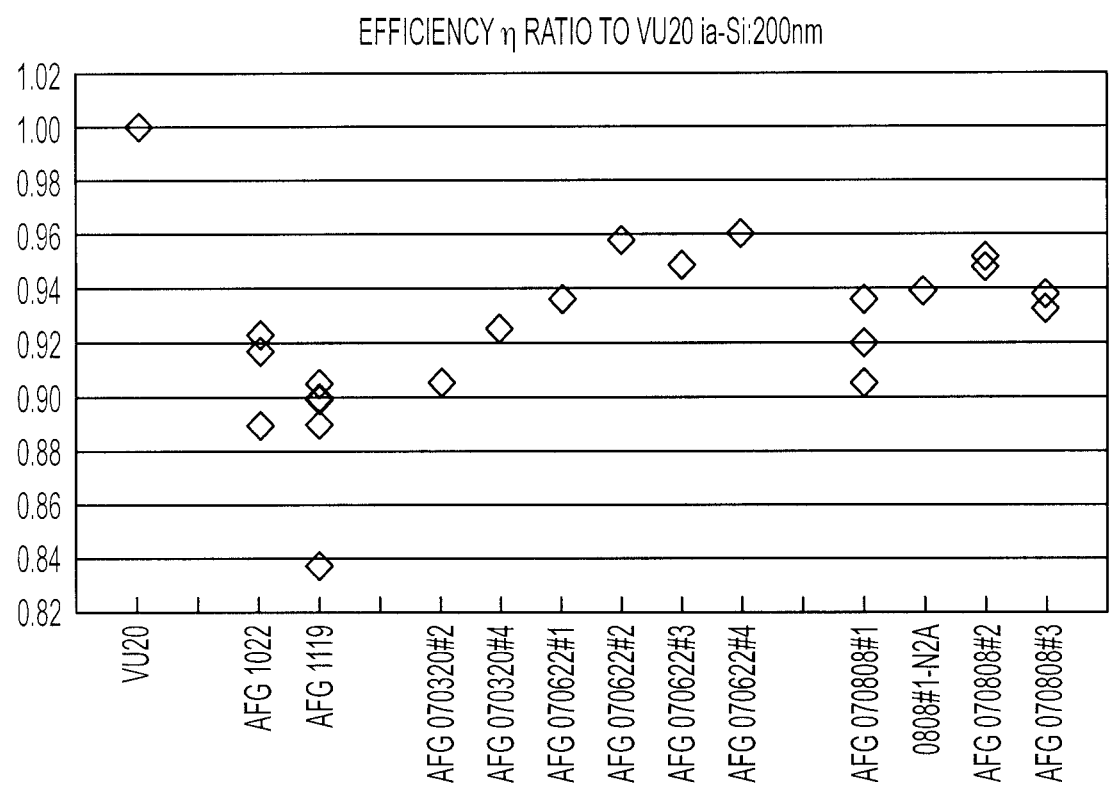
FIG. 10 shows efficiency comparative data for TCO 070808 and 070622 systems of the present invention as compared to standards AFG 1119 and 1022 as well as Asahi's VU20 system.

FIG. 10 shows PV device efficiencies for PV devices incorporating online produced 070808 and 070622 systems of the present invention as compared to online produced standards AFG 1119 and 1022 as well as Asahi's offline produced VU20 system. In this figure, the efficiency, η, for Asahi's VU20 system is normalized to a value of unity and all other data is interpreted as a percentage of the VU20 value. Also shown is data for system AFG 070320 samples 2 and 4. This system will not be discussed in detail herein.

With Asahi's VU20 system normalized to unity, the AFG standards 1119 and 1022 show efficiencies that are, at best, approximately 90% and 92% that of the VU20 system, respectively. Both TCO systems 070622, samples 1-4 and 070808, samples 1-3 show an increased efficiency when compared to both standard systems AFG 1119 and 1022. For system TCO 070622, sample 4 showed the best efficiency at approximately 96% that of Asahi's VU20 system. For system TCO 070808, sample 2 showed the best efficiency at approximately 95% that of Asahi's VU20 system.

The TCO of the present invention achieves, for the first time, an online produced TCO thin film on glass that demonstrates a post-production increase in the electrical conductivity without a decrease in transmittance. The increases in electrical conductivity brought about by making TCO thin films of the present invention have been observed at about 9% to as much as 57%, which can be attributed to the decrease in the barrier height at grain boundaries for electron transport by reducing the grain boundary with post-production cooling.

Vapor deposition of tin oxide thin films in the presence of oxidizing chemical additive is the first step realized towards achieving this post-production increase while simultaneously preserving the optical properties, such as transmittance, in the pre-production stages. After the TCO film has been deposited on a glass substrate, exposure to non-oxidizing or reducing conditions at elevated temperatures allows for improvement of the electrical properties of the TCO thin films that, when incorporated into a PV module, leads to a more efficient PV device.

Production methods of PV modules incorporating TCO thin films in accordance with the present invention will be recognized by those of skill in the art. Traditionally, heating under reduced pressure is the initial step of PV module production. Those of skill in the art will recognize and appreciate that the cooling step disclosed herein can be adapted to be the initial step of PV module production. Hence, the inventors of the subject matter of the present invention have demonstrated that it is possible to adapt existing glass production technology for production of PV module components.

The discovery of an on-line TCO system that will allow for a post-production improvement in the electrical properties of the TCO thin film represents an avenue for decreasing the time associated with manufacturing online TCO thin films as compared to TCO thin films manufactured offline. Hence, the subject matter of the present invention represents a viable method of allowing PV devices incorporating TCO thin films disclosed herein to become more competitive with traditional fossil fuel energies.

While the present invention has been described with respect to specific embodiments, it is not confined to the specific details set forth, but includes various changes and modifications that may suggest themselves to those skilled in the art, all falling within the scope of the invention as defined by the following claims.

What is claimed is:

1. A method of making a thin film device, the method comprising:
   depositing a first layer by pyrolytic chemical vapor deposition onto at least a portion of a substrate;
   depositing a second layer by pyrolytic chemical vapor deposition to form a transparent conductive film over at least a portion of the deposited first layer, the second layer comprising a tin oxide and being deposited from a gaseous mixture in the presence of an oxidizing chemical vapor and at an elevated temperature; and
   cooling the deposited first and second layers from the elevated temperature to ambient temperature in a non-oxidizing or slightly reducing atmosphere so as to provide a post-production increase of electrical conductivity of the second layer by at least 2%,
   wherein the oxidizing vapor is mixed with the gaseous mixture before said depositing of the second layer, for which the gaseous mixture is provided at 0.20-2.00 kg/min and comprises 70-95% monobutyl tin trichloride and 5-20% trifluoroacetic acid, and
   wherein the oxidizing chemical is selected from the group consisting of peroxides, nitric acid, nitrates, nitrites, nitrous oxide, sulfuric acid, sulfates, persulfates, hypochloric acid, chlorates, perchlorates, bromate, borates, and combinations thereof.

2. The method of claim 1, wherein the substrate is a glass substrate.

3. The method of claim 1, wherein the second layer comprises tin oxide, indium tin oxide, fluorine doped tin oxide, zinc tin oxide, or combinations thereof.

4. The method of claim 1, wherein the second layer comprises fluorine doped tin oxide.

5. The method of claim 1, wherein the first layer comprises silicon.

6. The method of claim 1, wherein the first layer comprises silicon in the form of an oxide, nitride, carbide, or combinations thereof.

7. The method of claim 1, wherein the first layer comprises silicon oxide, silicon dioxide, silicon nitride, silicon oxynitride, silicon carbide, silicon oxycarbide, or combinations thereof.

8. The method of claim 1, wherein the first layer comprises silicon oxycarbide.

9. The method of claim 1, wherein the oxidizing chemical is selected from the group consisting of nitric acid, nitrous oxide, hypochloric acid, and sulfuric acid.

10. The method of claim 1, wherein the oxidizing chemical agent is nitric acid.

11. The method of claim 1, wherein the elevated temperature is a temperature in the range of 200° C. to 800° C.

12. The method of claim 1, wherein the elevated temperature is a temperature in the range of 450° C. to 750° C.

13. The method of claim 1, wherein the first layer has a thickness of 400 Å to 1000 Å.

14. The method of claim 1, wherein the first layer has a thickness of 600 Å to 900 Å.

15. The method of claim 1, wherein the first layer has a thickness of 700 Å to 800 Å.

16. The method of claim 1, wherein the second layer has a thickness of 300 nm to 1200 nm.

17. The method of claim 1, wherein the second layer has a thickness of 500 nm to 1000 nm.

18. The method of claim 1, wherein the oxidizing chemical provides an increase in light transmittance by at least about 2%.

19. The method of claim 1, wherein said deposition of the first layer further comprises providing 2.0-40.0 g/min of silane, 50.0-300.0 g/min of carbon dioxide, 0.0-110.0 g/min of ethylene, and 0.0-200.0 g/min of nitrogen.

20. The method of claim 1, wherein said deposition of the second layer further comprises providing 0.00-5.00 kg/min of water vapor, 0.00-2.00 kg/min of air, and 0.20-1.50 kg/min of an aqueous solution of 60%-80% nitric acid.

* * * * *